United States Patent
Fu et al.

(10) Patent No.: US 9,595,466 B2
(45) Date of Patent: Mar. 14, 2017

(54) METHODS FOR ETCHING VIA ATOMIC LAYER DEPOSITION (ALD) CYCLES

(71) Applicant: APPLIED MATERIALS, INC., Santa Clara, CA (US)

(72) Inventors: Xinyu Fu, Pleasanton, CA (US); Srinivas Gandikota, Santa Clara, CA (US); Mei Chang, Saratoga, CA (US); Seshadri Ganguli, Sunnyvale, CA (US); Guoqiang Jian, San Jose, CA (US); Yixiong Yang, San Jose, CA (US); Vikash Banthia, Mountain View, CA (US); Jonathan Bakke, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/717,740

(22) Filed: May 20, 2015

(65) Prior Publication Data
US 2016/0276214 A1    Sep. 22, 2016

Related U.S. Application Data

(60) Provisional application No. 62/136,018, filed on Mar. 20, 2015.

(51) Int. Cl.
*H01L 21/44* (2006.01)
*H01L 21/768* (2006.01)

(52) U.S. Cl.
CPC .. *H01L 21/76816* (2013.01); *H01L 21/76879* (2013.01)

(58) Field of Classification Search
CPC ... C23C 16/14; C23C 16/06; C23C 16/45525; C23C 16/45551;
(Continued)

(56) References Cited

U.S. PATENT DOCUMENTS

| 7,844,705 B2 | 11/2010 | Jones et al. |
| 2003/0008070 A1 | 1/2003 | Seutter et al. |

(Continued)

FOREIGN PATENT DOCUMENTS

KR  10-2004-0087406 A   10/2004

OTHER PUBLICATIONS

International Search Report and Written Opinion mailed Jun. 29, 2016 for PCT Application No. PCT/US2016/023110.

*Primary Examiner* — Robert Bachner
(74) *Attorney, Agent, or Firm* — Moser Taboada; Alan Taboada

(57) ABSTRACT

Methods for etching a substrate are provided herein. In some embodiments, a method for etching a substrate disposed within a processing volume of a process chamber includes: (a) exposing a first layer disposed atop the substrate to a first gas comprising tungsten chloride ($WCl_x$) for a first period of time and at a first pressure, wherein x is 5 or 6; (b) purging the processing volume of the first gas using an inert gas for a second period of time; (c) exposing the substrate to a hydrogen-containing gas for a third period of time to etch the first layer after purging the processing volume of the first gas; and (d) purging the processing volume of the hydrogen-containing gas using the inert gas for a fourth period of time.

19 Claims, 3 Drawing Sheets

(58) Field of Classification Search
CPC ........ C23C 16/45563; C23C 16/45565; C23C 16/4557; C23C 16/45574; C23C 16/0209; C23C 16/0227; C23C 16/0281; C23C 16/045; C23C 16/45523
See application file for complete search history.

(56) References Cited

U.S. PATENT DOCUMENTS

| | | |
|---|---|---|
| 2003/0203616 A1 | 10/2003 | Chung et al. |
| 2004/0259344 A1* | 12/2004 | Park .................. H01L 21/76838 438/605 |
| 2005/0124154 A1 | 6/2005 | Park et al. |
| 2009/0014879 A1 | 1/2009 | Park et al. |
| 2011/0159690 A1 | 6/2011 | Chandrashekar et al. |
| 2011/0221044 A1 | 9/2011 | Danek et al. |
| 2011/0233778 A1 | 9/2011 | Lee et al. |
| 2012/0003833 A1 | 1/2012 | Khandelwal et al. |
| 2013/0005140 A1 | 1/2013 | Jeng et al. |
| 2014/0030889 A1 | 1/2014 | Chen et al. |
| 2014/0120700 A1 | 5/2014 | Wang et al. |
| 2014/0120723 A1* | 5/2014 | Fu .................... H01L 21/28506 438/680 |
| 2015/0179461 A1* | 6/2015 | Bamnolker ....... H01L 21/28556 438/656 |
| 2015/0294906 A1 | 10/2015 | Wu et al. |
| 2016/0104624 A1 | 4/2016 | Fu et al. |

\* cited by examiner

METHODS FOR ETCHING VIA ATOMIC LAYER DEPOSITION (ALD) CYCLES

CROSS-REFERENCE TO RELATED APPLICATIONS

This application claims benefit of U.S. provisional patent application Ser. No. 62/136,018, filed Mar. 20, 2015, which is herein incorporated by reference in its entirety.

FIELD

Embodiments of the present disclosure generally relate to methods of etching a substrate via atomic layer deposition cycles.

BACKGROUND

Fabrication of integrated circuits and other microelectronic devices include processes to fill features formed in or on a substrate. For example, such features may be filled with a conductive material to form a conductive pathway between devices or regions of an integrated circuit or microelectronic device. In some processes, such as physical vapor deposition (PVD), chemical vapor deposition (CVD), or atomic layer deposition (ALD) can be used to deposit material onto the substrate and within the features. These processes can be used to form a layer along the surfaces of the feature and/or to completely fill the feature.

The inventors have observed that using typical deposition processes with ever-shrinking semiconductor devices results in the buildup of overhang in the features and the incapability to provide sufficient step coverage (e.g., coverage on bottom and sidewalls of the feature as compared to the top surface of the substrate), or more specifically, sidewall coverage with no overhang on the feature top. In particular, the undesirable buildup of material near the upper opening of the features, referred to as overhang, can cause the opening of the feature to be closed off prematurely, undesirably forming a pocket, or void, where no material is present.

Accordingly, the inventors have developed improved techniques to etch a substrate via atomic layer deposition cycles.

SUMMARY

Methods for etching a substrate are provided herein. In some embodiments, a method for processing a substrate disposed within a processing volume of a process chamber includes: (a) exposing a first layer disposed atop the substrate to a first gas comprising tungsten chloride ($WCl_x$) for a first period of time and at a first pressure, wherein x is 5 or 6; (b) purging the processing volume of the first gas using an inert gas for a second period of time; (c) exposing the substrate to a hydrogen-containing gas for a third period of time to etch the first layer after purging the processing volume of the first gas; and (d) purging the processing volume of the hydrogen-containing gas using the inert gas for a fourth period of time.

In some embodiments, a method for processing a substrate disposed within a processing volume of a process chamber includes: (a) depositing a first layer atop a first surface of the substrate and within a feature formed in the first surface, the feature comprising an opening defined by one or more sidewalls, a bottom surface and upper corners, wherein a thickness of the first layer is greater proximate the upper corners of the opening than at the sidewalls and bottom of the opening; (b) exposing a first layer disposed atop the substrate to a first gas comprising tungsten chloride ($WCl_x$) for a first period of time of about 0.1 seconds to about 1 second and at a first pressure, wherein x is 5 or 6; (c) purging the processing volume of the first gas using an inert gas for a second period of time of about 0.1 seconds to about 1 second; (d) exposing the substrate to a hydrogen-containing gas for a third period of time to etch the first layer after purging the processing volume of the first gas, wherein the third period of time is about 0.5 seconds to about 2 seconds; (e) purging the processing volume of the hydrogen-containing gas using the inert gas for a fourth period of time of about 0.1 seconds to about 1 second; (f) repeating (b)-(f) to etch the first layer to a predetermined thickness; and (g) depositing a conductive layer to fill the feature.

In some embodiments, a method of processing a substrate disposed within a processing volume of a process chamber includes exposing a first layer disposed atop the substrate to a first gas comprising tungsten chloride ($WCl_x$) and an inert gas for a first period of time, wherein x is 5 or 6.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
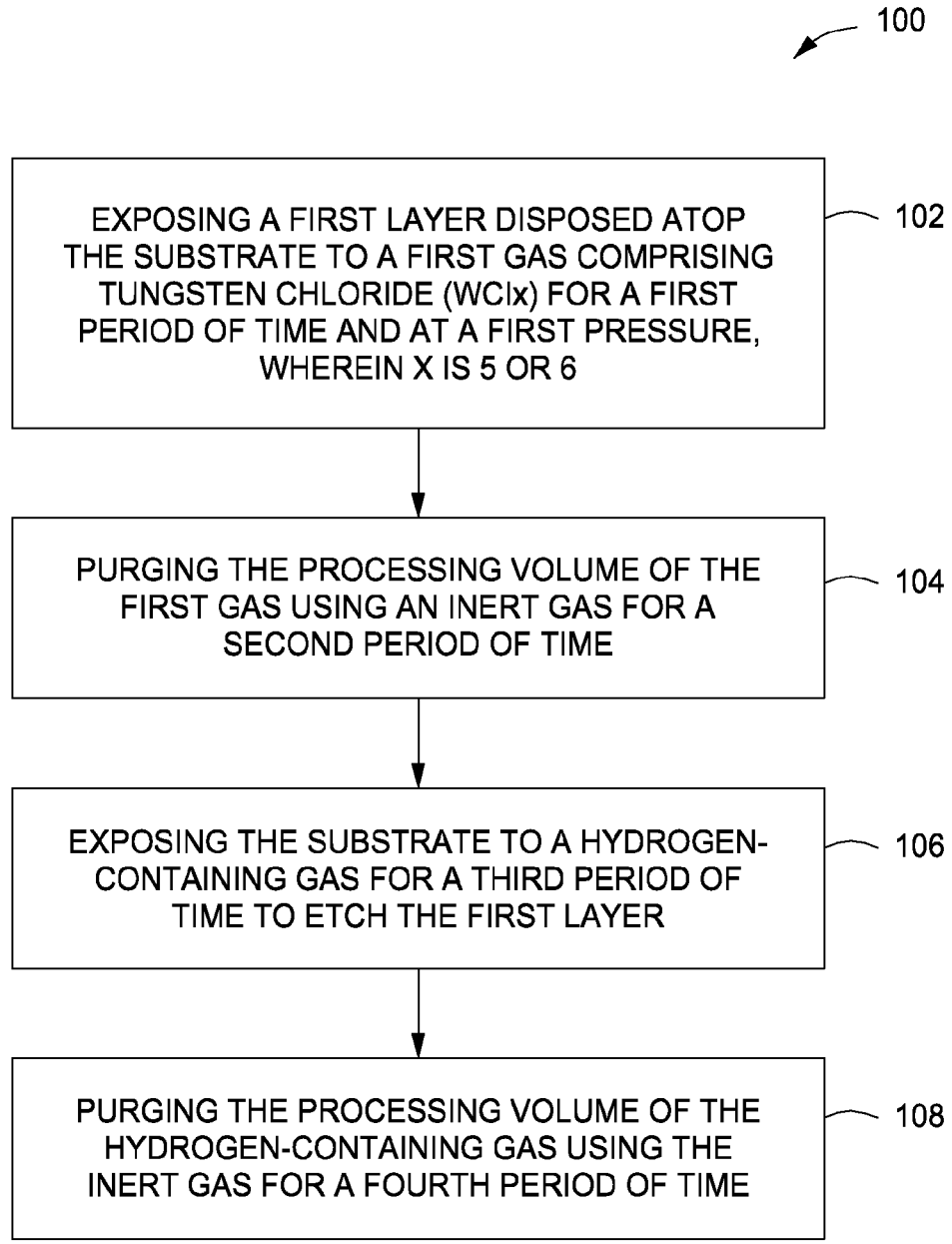
FIG. 1 depicts a flow chart of a method for etching a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for etching a substrate are provided herein. The inventive methods advantageously facilitate reducing or eliminating overhang of material in the feature to lessen the incidence of void formation during feature filling processes. The inventive methods may be utilized in the formation of metal interconnects in an integrated circuit, or in the formation of a metal gate or a metal-contact gap fill process, as well as other suitable applications where filling a feature may be performed.

Figure 2A:
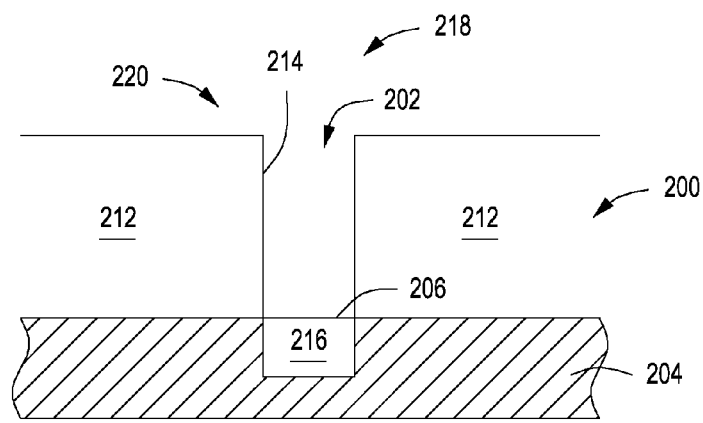
FIGS. 2A-C depict the stages of etching a substrate in accordance with some embodiments of the present disclosure.
Figure 2B:
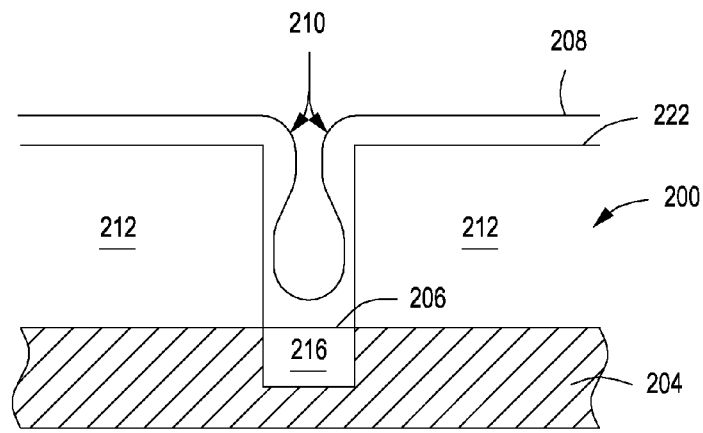
Figure 2C:
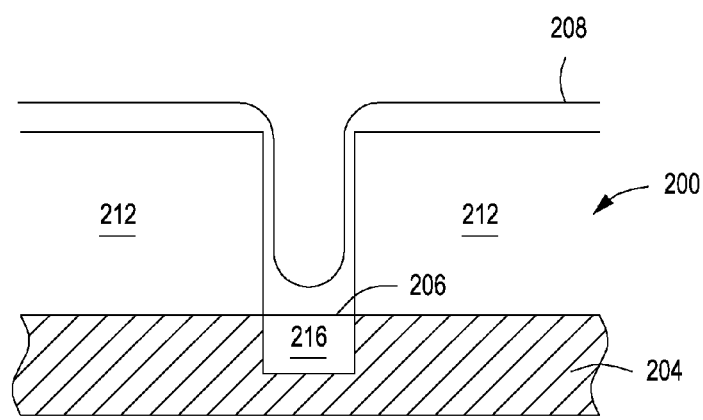

FIG. 1 depicts a flow chart of a method 100 for processing a substrate in accordance with some embodiments of the present disclosure. The method 100 is described below with respect to the stages of processing a substrate as depicted in FIGS. 2A-2C and may be performed, for example, in a suitable reactor, such as is described below with respect to FIG. 3.

The method 100 is typically performed on a substrate 200 provided to a processing volume of a process chamber, for example process chamber 302 described below with respect to FIG. 3. In some embodiments, as shown in FIG. 2A, the substrate 200 includes one or more features 202 to be filled, formed in a layer 212 of the substrate 200, and extending towards a base 204 of the substrate 200. The substrate 200 may be any suitable substrate having the one or more features 202 formed in the substrate 200. For example, the substrate 200 may comprise one or more of silicon (Si), silicon oxide ($SiO_2$), or the like. In some embodiments, the layer 212 may be a dielectric layer. In addition, the substrate 200 may include additional layers of materials or may have one or more completed or partially completed structures or devices formed in or on the substrate 200.

The feature 202 may be formed by etching the substrate 200 using any suitable etch process. In some embodiments, the feature 202 comprises an opening 218 defined by one or more sidewalls 214, a bottom surface 206 and upper corners 220. In some embodiments, the feature 202 may be a via, contact, trench, dual damascene, or the like. In some embodiments, the feature 202 may have a high aspect ratio, e.g., an aspect ratio of about 5:1 or more. As used herein, the aspect ratio is the ratio of a depth of the feature to a width of the feature.

In some embodiments, a device 216, such as a logic device or the like, or a portion of a device requiring electrical connectivity, such as a gate, a contact pad, a conductive via, or the like, may be disposed in the base 204 of the substrate 200 and aligned with the feature 202. For example, the feature 202 may be filled with a conductive material to form a conductive pathway to the device 216.

In some embodiments, as shown in FIG. 2B, the first layer 208 is deposited atop the first surface 222 of the substrate 200 and within the feature 202 formed in the first surface. The first layer 208 may be deposited using any suitable deposition process, for example a physical vapor deposition process (PVD), a chemical vapor deposition process (CVD), an atomic layer deposition process (ALD), or the like. In some embodiments, the first layer 208 is a conductive material used to fill the feature 202, for example, to form a conductive pathway to the device 216. In some embodiments, the first layer 208 may be a barrier layer. A "barrier layer," as used herein, may refer to a layer conformably formed along at least a portion of the sidewalls and/or lower surface of a feature such that a substantial portion of the feature prior to the deposition of the layer remains unfilled after deposition of the layer. In some embodiments, the barrier layer may be formed along the entirety of the sidewalls and lower surface of the feature. In some embodiments, the first layer is a metal containing layer. For example, in some embodiments, the first layer may contain tungsten (W), aluminum (Al), titanium (Ti), tantalum (Ta), oxides or nitrides thereof, silicides thereof, derivatives thereof, or combinations thereof.

In some embodiments, the thickness of the first layer 208 is greater proximate the upper corners of the opening than at the sidewalls and bottom of the opening. As a result, an overhang 210 forms at the edges of the first layer 208 surrounding the feature 202. In some embodiments, for example where the first layer 208 is deposited via a PVD process, the overhang 210 may form at least in part due to the disorderliness of the deposition process, such as ionized metal atoms traveling in multiple directions and are not all directed perfectly downward. 102-108, as described below, advantageously facilitate reducing or eliminating overhang of material in the feature 202 to lessen the incidence of void formation during feature filling processes.

The method 100 begins at 102 by exposing the first layer 208 disposed atop a substrate 200 to a first gas comprising tungsten chloride ($WCl_x$) for a first period of time and at a first pressure, wherein x is 5 or 6. In some embodiments, the first gas comprises tungsten hexachloride ($WCl_6$). In some embodiments, the first gas comprises tungsten pentachloride ($WCl_5$). In some embodiments, a first gas comprising, for example, tungsten hexachloride ($WCl_6$) is provided to the process chamber by vaporizing solid tungsten hexachloride ($WCl_6$) at a temperature of about 150 degrees Celsius to about 160 degrees Celsius and flowing the tungsten hexachloride ($WCl_6$) to the process chamber using a carrier gas, such as argon. While tungsten chloride ($WCl_x$) is typically used in deposition processes, the inventors have observed that tungsten chloride ($WCl_x$) can advantageously be used in an etch process, to etch for example metal-containing layers. Without wishing to be bound by theory, the inventors have observed that the chlorine will react with the metal containing first layer 208 to form a metal chloride which can be easily etched.

The inventors have observed that the pressure in the process chamber is a factor in controlling the etch process. In some embodiments, at a first pressure of for example greater than about 7.5 Torr, or for example at a first pressure greater than about 10 Torr, the first layer 208 is conformally etched from the first surface 222 of the substrate 200 and from the one or more sidewalls 214, the bottom surface 206 and the upper corners 220 of the opening 218. In some embodiments, at a first pressure of less than about 7.5 Torr the first layer 208 is selectively etched from the first surface 222 and from the upper corners 220 of the opening 218 (i.e. the first layer is etched at a faster rate from the first surface 222 and the upper corners 220 than from the one or more sidewalls 214 and the bottom surface 206 of the feature 202). In some embodiments, the substrate 200 is exposed to the first gas for a first period of time sufficient to saturate the surface of the substrate 200 with tungsten chloride ($WCl_x$). For example, in some embodiments, the first period of time is about 0.1 seconds to about 1 second. In some embodiments, the method 100 is performed at a temperature of greater than about 200 degrees Celsius, for example a temperature of about 400° Celsius to about 450° Celsius.

In some embodiments, prior to exposing the first layer 208 to the first gas, the first layer 208 is exposed to a second gas for a second period of time. In some embodiments, the second gas comprises tungsten chloride ($WCl_x$) and an inert gas. In some embodiments, x is 5 or 6. In some embodiments, the second gas comprises tungsten hexachloride ($WCl_6$). In some embodiments, the second gas comprises tungsten pentachloride ($WCl_6$). In some embodiments, the inert gas is argon, helium, or the like. The inventors have observed that in some embodiments a tungsten chloride ($WCl_x$) soak process can be used to selectively etch the first layer 208, for example a tantalum nitride layer, without etching an adjacent layer, such as a titanium nitride (TiN) layer. In some embodiments, the first layer 208 is exposed to the second gas for about 10 to about 120 seconds. In some embodiments, the first layer 208 is exposed to the second gas at a temperature of about 200 to about 500 degrees Celsius. In some embodiments, the first layer 208 is exposed to the second gas at a pressure of about 1 to about 50 Torr. In some embodiments, the tungsten chloride ($WCl_x$) is provided at a flow rate of about 1 to about 50 sccm. In some embodiments, the inert gas is provided at a flow rate of about 50 to about 1000 sccm.

In some embodiments, prior to exposing the first layer 208 to the first gas or prior to exposing the first layer 208 to the second gas, the first layer 208 may be exposed to an oxygen-containing gas, for example oxygen ($O_2$), water vapor ($H_2O$), or the like. The inventors have observed that incorporation of oxygen into the first layer 208 improves the etch rate of the first layer 208. For example, in embodiments where the first layer 208 is a tantalum nitride (TaN) layer, the incorporation of oxygen into the tantalum nitride (TaN) layer can improve the etch rate by about 1.5 to about 3 times.

Next, at 104, the processing volume of the process chamber is purged of the first gas. In some embodiments, the first gas is purged using any suitable inert gas, for example argon, xenon, helium, or the like. In some embodiments, the processing volume is purged for a second period of time sufficient to purge the first gas. For example, in some embodiments, the second period of time is about 0.1 seconds to about 1 second.

Next, at 106, the substrate 200 is exposed to a hydrogen-containing gas for a third period of time to etch the first layer 208 after purging the processing volume of the first gas. The hydrogen-containing gas may comprise any gas or gases suitable to provide a high density of atomic hydrogen to the substrate 200. For example, in some embodiments, the hydrogen containing gas may comprise or may consist essentially of or may consist of hydrogen ($H_2$) gas, ammonia ($NH_3$), hydrogen peroxide ($H_2O_2$), combinations thereof, or the like. In some embodiments, the hydrogen containing gas may further comprise a diluting gas, for example such as one or more of helium (He), Argon (Ar), or the like. The hydrogen-containing gas may be provided at any flow rate suitable to provide a sufficient amount of atomic hydrogen to etch the first layer 208 and may be adjusted in accordance with the substrate 200 and/or process chamber size. For example, in some embodiments the hydrogen-containing gas may be provided at a flow rate of up to about 3 slm. In some embodiments, the substrate 200 is exposed to the hydrogen-containing gas for a third period of time sufficient to etch the first layer 208 to a predetermined thickness. For example, in some embodiments, the third period of time is about 0.5 seconds to about 2 seconds. Without wishing to be bound by theory, the inventors have observed that the hydrogen reacts to etch the metal chloride formed in 102 above. The inventors have observed that pulsing the tungsten chloride ($WCl_x$) at 102 and then subsequently pulsing the hydrogen-containing gas at 106, advantageously provides a higher ratio of chlorine to hydrogen at the surface of the first layer 208 to enable the etching process.

Next, at 108, the processing volume is purged of the hydrogen-containing gas using the inert gas for a fourth period of time. The fourth period of time may be the same as the second period of time, discussed above. As described above, the hydrogen-containing gas is purged using any suitable inert gas, for example argon, xenon, helium, or the like. The processing volume is purged for the fourth period of time sufficient to purge the hydrogen-containing gas.

In some embodiments, 102-108 can be repeated to at least partially reduce a thickness of the first layer proximate the upper corners (i.e. the overhang). The result of method 100, as illustrated in FIG. 2C, shows a substantially uniform first layer 208 on the sidewalls 214 of the feature 202 without overhang. Although illustrated with no overhang, embodiments of the present disclosure may advantageously reduce overhang sufficient to reduce void formation, but without completely eliminating the overhang.

Following the method 100, the feature 202 may be filled with a conductive fill material. In some, the conductive fill material is the same as the material of the first layer 208. For example, in some embodiments, the conductive fill material may be tungsten. For example, tungsten conductive fill material may be deposited in the feature 202 by optionally depositing a titanium nitride barrier layer using any suitable deposition process, such as CVD or PVD, followed by forming a tungsten seed layer in the feature 202 using any suitable tungsten deposition process, such as a tungsten CVD or ALD process, followed by a bulk tungsten material deposition to fill the feature 202 using a tungsten hexafluoride CVD process. In some embodiments, the substrate 200 is optionally exposed to a second process gas, such as a nitrogen-containing gas, prior to depositing the tungsten fill material, wherein the second process gas conditions the first surface 222 to suppress the growth of the tungsten material on the first surface 222, resulting in faster growth on the sidewalls 214 and the bottom surface 206 of the feature 202. In some embodiments, tungsten conductive fill material may be deposited in the feature 202 via a tungsten deposition process as described in commonly owned U.S. patent application Ser. No. 14/300,773, filed Jun. 10, 2014 or as described in commonly owned U.S. Pat. No. 6,936,538.

In some embodiments, the first layer 208 may be a titanium layer as described above, deposited via a PVD process. In some embodiments, the first layer 208, for example the titanium layer, may be annealed as part of an interconnect formation process resulting in the formation of a titanium silicide layer with an underlying silicon layer, for example layer 212. The anneal process may result in unreacted titanium and the formation of a native oxide layer, for example titanium oxide (TiO) atop the substrate 200. The method 100 may advantageously be used to etch any unreacted titanium and titanium oxide without etching the titanium silicide layer as well as to remove any overhang 210 formed on the feature 202 as described above.

In some embodiments, the first layer 208 disposed atop a substrate 200 is exposed to a first gas comprising tungsten chloride ($WCl_x$) and an inert gas for a first period of time. In some embodiments, x is 5 or 6. In some embodiments, the first gas comprises tungsten hexachloride ($WCl_6$). In some embodiments, the first gas comprises tungsten pentachloride ($WCl_5$). In some embodiments, the inert gas is argon, helium, or the like. The inventors have observed that in some embodiments a tungsten chloride ($WCl_x$) soak process is sufficient to etch the first layer 208. In some embodiments, the first layer 208 is exposed to the first gas for about 10 to about 120 seconds. In some embodiments, the first layer 208 is exposed to the first gas at a temperature of about 200 to about 500 degrees Celsius. In some embodiments, the first layer 208 is exposed to the first gas at a pressure of about 1 to about 50 Torr. In some embodiments, the tungsten chloride ($WCl_x$) is provided at a flow rate of about 1 to about 50 sccm. In some embodiments, the inert gas is provided at a flow rate of about 50 to about 1000 sccm.

Figure 3:
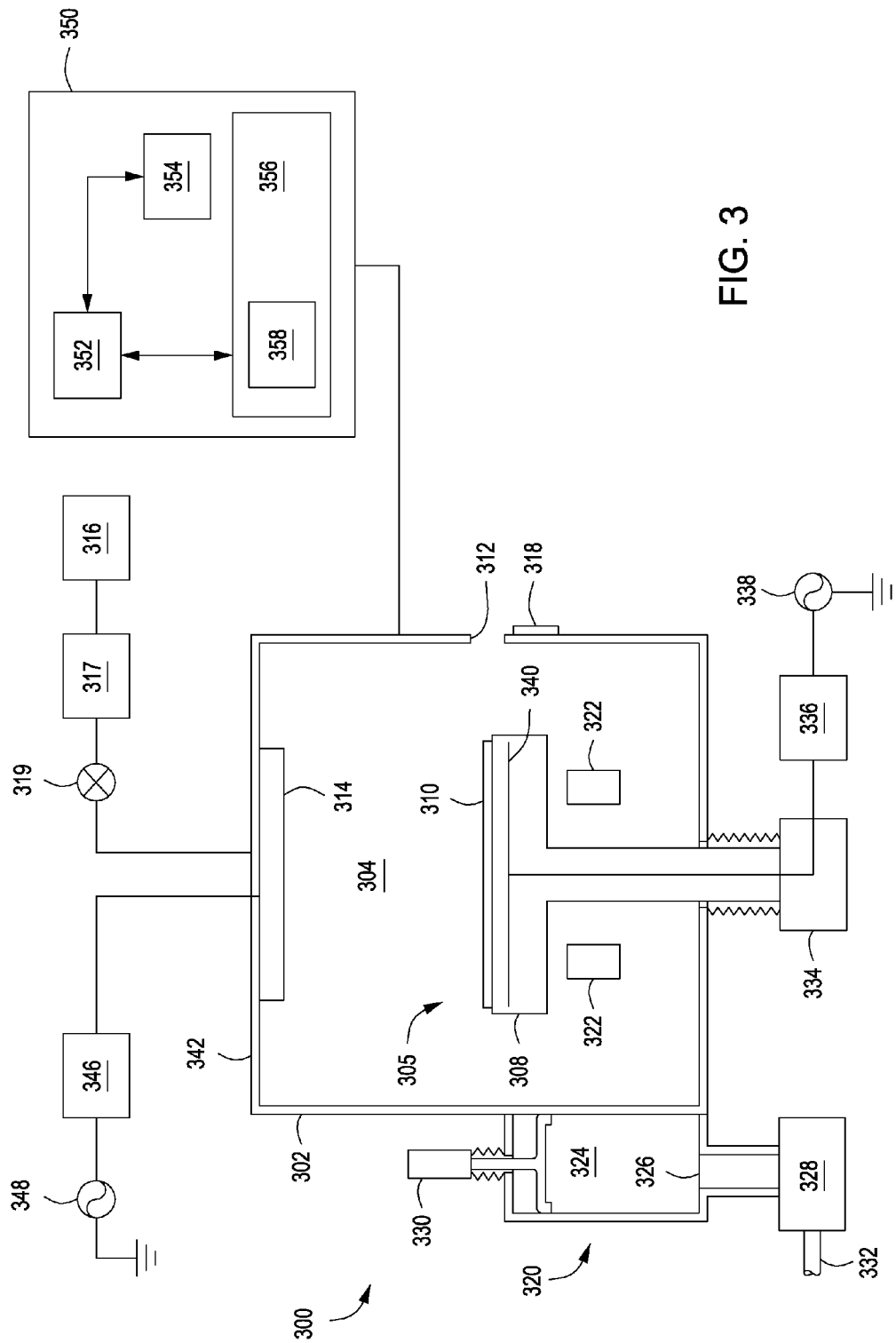
FIG. 3 depicts a process chamber suitable for performing a method of etching a substrate in accordance with some embodiments of the present disclosure.

FIG. 3 depicts a schematic diagram of an illustrative apparatus 300 of the kind that may be used to practice embodiments of the disclosure as discussed herein. The apparatus 300 may be any apparatus suitable for performing one or more substrate processes, for example but not limited to, deposition process such as chemical vapor deposition (CVD), atomic layer deposition (ALD), or the like. In some embodiments the process chamber 302 may be a standalone apparatus 300, as depicted below, or a the process chamber 302 may be part of a cluster tool, such as one of the CENTURA®, PRODUCER®, or ENDURA® cluster tools available from Applied Materials, Inc. of Santa Clara, Calif.

The apparatus 300 may comprise a controller 350 and a process chamber 302 having an exhaust system 320 for removing excess process gases, processing by-products, or the like, from the inner volume 305 of the process chamber 302. Exemplary process chambers may include any of several process chambers configured for chemical vapor deposition (CVD) or atomic layer deposition (ALD), available from Applied Materials, Inc. of Santa Clara, Calif. Other suitable process chambers from other manufacturers may similarly be used.

The process chamber 302 has an inner volume 305 that may include a processing volume 304. The processing volume 304 may be defined, for example, between a substrate support 308 disposed within the process chamber 302 for supporting a substrate 310 during processing and one or more gas inlets, such as a showerhead 314 and/or nozzles provided at suitable locations. In some embodiments, the substrate support 308 may include a mechanism that retains or supports the substrate 310 on the surface of the substrate support 308, such as an electrostatic chuck, a vacuum chuck, a substrate retaining clamp, or the like (not shown). In some embodiments, the substrate support 308 may include mechanisms for controlling the substrate temperature (such as heating and/or cooling devices, not shown) and/or for controlling the species flux and/or ion energy proximate the substrate surface.

For example, in some embodiments, the substrate support 308 may include an RF bias electrode 340. The RF bias electrode 340 may be coupled to one or more bias power sources (one bias power source 338 shown) through one or more respective matching networks (matching network 336 shown). The one or more bias power sources may be capable of producing up to 1200 W or RF energy at a frequency of about 2 MHz to about 60 MHz, such as at about 2 MHz, or about 13.56 MHz, or about 60 Mhz. In some embodiments, two bias power sources may be provided for coupling RF power through respective matching networks to the RF bias electrode 340 at respective frequencies of about 2 MHz and about 13.56 MHz. The at least one bias power source may provide either continuous or pulsed power. In some embodiments, the bias power source alternatively may be a DC or pulsed DC source.

The substrate 310 may enter the process chamber 302 via an opening 312 in a wall of the process chamber 302. The opening 312 may be selectively sealed via a slit valve 318, or other mechanism for selectively providing access to the interior of the process chamber through the opening 312. The substrate support 308 may be coupled to a lift mechanism 334 that may control the position of the substrate support 308 between a lower position (as shown) suitable for transferring substrates into and out of the process chamber via the opening 312 and a selectable upper position suitable for processing. The process position may be selected to maximize process uniformity for a particular process. When in at least one of the elevated processing positions, the substrate support 308 may be disposed above the opening 312 to provide a symmetrical processing region.

The one or more gas inlets (e.g., the showerhead 314) may be coupled to a gas supply 316 for providing one or more process gases through a mass flow controller 317 into the processing volume 304 of the process chamber 302. In addition, one or more valves 319 may be provided to control the flow of the one or more process gases. The mass flow controller 317 and one or more valves 319 may be used individually, or in conjunction, to provide the process gases at predetermined flow rates, such as at a constant flow rate, or pulsed.

Although a showerhead 314 is shown in FIG. 3, additional or alternative gas inlets may be provided such as nozzles or inlets disposed in the ceiling or on the sidewalls of the process chamber 302 or at other locations suitable for providing gases to the process chamber 302, such as the base of the process chamber, the periphery of the substrate support, or the like.

The apparatus 300 has the capability to utilize capacitively coupled RF energy for plasma processing. For example, the process chamber 302 may have a ceiling 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown). The one or more plasma sources may be capable of producing up to about 3,000 W, or in some embodiments, up to about 5,000 W, of RF energy at a frequency of about 2 MHz and/or about 13.56 MHz or a high frequency, such as 27 MHz and/or 60 MHz. The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown). The vacuum pump 328 may be fluidly coupled to an exhaust outlet 332 for routing the exhaust to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be one of any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, the disclosure may be implemented in software and executed using a computer system, in hardware as, e.g., an application specific integrated circuit or other type of hardware implementation, or as a combination of software and hardware. The software routine 358 may be executed after the substrate 310 is positioned on the substrate support 308. The software routine 358, when executed by the CPU 352, transforms the general purpose computer into a specific purpose computer (controller) 350 that controls the process chamber operation such that the methods disclosed herein are performed.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of processing a substrate disposed within a processing volume of a process chamber, comprising:
   (a) exposing a metal-containing first layer disposed atop the substrate to a first gas comprising tungsten chloride ($WCl_x$) for a first period of time and at a first pressure wherein the tungsten chloride ($WCl_x$) reacts with the metal-containing first layer to form a metal chloride, and wherein x is 5 or 6;
   (b) purging the processing volume of the first gas using an inert gas for a second period of time;
   (c) etching the metal chloride by exposing the substrate to a hydrogen-containing gas for a third period of time after purging the processing volume of the first gas; and
   (d) purging the processing volume of the hydrogen-containing gas using the inert gas for a fourth period of time.

2. The method of claim 1, further comprising depositing the first layer atop a first surface of the substrate and within a feature formed in the first surface, the feature comprising an opening defined by one or more sidewalls, a bottom surface and upper corners, wherein a thickness of the first layer is greater proximate the upper corners of the opening than at the sidewalls and bottom of the opening.

3. The method of claim 2, further comprising repeating (a)-(d) to at least partially reduce a thickness of the first layer proximate the upper corners.

4. The method of claim 2, wherein the first pressure is greater than about 7.5 Torr to conformally etch the first layer from the first surface of the substrate and from the one or more sidewalls, the bottom surface and the upper corners of the opening.

5. The method of claim 2, wherein the first pressure is less than about 7.5 Torr to selectively etch the first layer from the first surface of the substrate and from the upper corners of the opening.

6. The method of claim 2, further comprising depositing a conductive layer to fill the feature.

7. The method of claim 6, further comprising depositing a barrier layer in the feature prior to depositing the conductive layer to fill the feature.

8. The method of claim 7, further comprising depositing a seed layer atop the barrier layer prior to depositing the conductive layer to fill the feature.

9. The method of claim 8, further comprising exposing the substrate to a second process gas prior to depositing the conductive layer, wherein the second process gas conditions the first surface to suppress a growth of the conductive layer on the first surface.

10. The method of claim 9, wherein the second process gas is a nitrogen containing gas.

11. The method of claim 1, wherein the first period of time is about 0.1 seconds to about 1 second.

12. The method of claim 1, wherein the second period of time is about 0.1 seconds to about 1 second.

13. The method of claim 1, wherein the third period of time is about 0.5 seconds to about 2 seconds.

14. The method of claim 1, wherein the process chamber has a temperature during (a)-(d) of 400° Celsius to 450° Celsius.

15. The method of claim 1, further comprising exposing the first layer to a second gas for a second period of time prior to exposing the first layer to the first gas, wherein the second gas comprises tungsten chloride ($WCl_x$) and an inert gas and wherein x is 5 or 6.

16. The method of claim 1, further comprising exposing the first layer to an oxygen containing gas prior to exposing a first layer to the first gas.

17. A method of processing a substrate disposed within a processing volume of a process chamber, comprising:
   (a) depositing a first layer atop a first surface of the substrate and within a feature formed in the first surface, the feature comprising an opening defined by one or more sidewalls, a bottom surface and upper corners, wherein a thickness of the first layer is greater proximate the upper corners of the opening than at the sidewalls and bottom of the opening;
   (b) exposing a first layer disposed atop the substrate to a first gas comprising tungsten chloride ($WCl_x$) for a first period of time of about 0.1 seconds to about 1 second and at a first pressure, wherein x is 5 or 6;
   (c) purging the processing volume of the first gas using an inert gas for a second period of time of about 0.1 seconds to about 1 second;
   (d) exposing the substrate to a hydrogen-containing gas for a third period of time to etch the first layer after purging the processing volume of the first gas, wherein the third period of time is about 0.5 seconds to about 2 seconds;
   (e) purging the processing volume of the hydrogen-containing gas using the inert gas for a fourth period of time of about 0.1 seconds to about 1 second;
   (f) repeating (b)-(f) to etch the first layer to a predetermined thickness; and
   (g) depositing a conductive layer to fill the feature.

18. A method of processing a substrate disposed within a processing volume of a process chamber, comprising:
   annealing a substrate having a titanium layer disposed atop an underlying silicon layer to form a titanium silicide layer, wherein a portion of the titanium layer does not react with the underlying silicon layer to form titanium silicide and wherein a native oxide layer is formed on the titanium silicide layer; and
   selectively etching the unreacted portion of the titanium layer and the native oxide layer with respect to the titanium silicide layer by exposing the substrate to a first gas comprising tungsten chloride ($WCl_x$) and an inert gas for a first period of time, wherein x is 5 or 6.

19. The method claim 18, further comprising exposing the titanium layer to an oxygen containing gas prior to exposing the substrate to the first gas.

* * * * *